United States Patent
O

(10) Patent No.: US 7,499,333 B2
(45) Date of Patent: Mar. 3, 2009

(54) BOOST VOLTAGE GENERATING CIRCUIT AND METHOD THEREOF

(75) Inventor: Se-Eun O, Suwon-si (KR)

(73) Assignee: Samsung Electronics., Ltd., Gyeonggi-do (KR)

(*) Notice: Subject to any disclaimer, the term of this patent is extended or adjusted under 35 U.S.C. 154(b) by 44 days.

(21) Appl. No.: 11/652,556

(22) Filed: Jan. 12, 2007

(65) Prior Publication Data

US 2007/0201283 A1 Aug. 30, 2007

(30) Foreign Application Priority Data

Feb. 25, 2006 (KR) ................. 10-2006-0018516

(51) Int. Cl.
  *G11C 11/34* (2006.01)
  *G11C 16/06* (2006.01)
  *G11C 5/14* (2006.01)
  *G11C 7/00* (2006.01)

(52) U.S. Cl. ............... 365/185.23; 365/189.09; 365/226; 365/189.11

(58) Field of Classification Search ............ 365/189.09, 365/226, 189.11, 185.18, 185.23
See application file for complete search history.

(56) References Cited

U.S. PATENT DOCUMENTS

| | | | |
|---|---|---|---|
| 6,208,198 B1 * | 3/2001 | Lee ........................... | 327/536 |
| 6,330,173 B1 | 12/2001 | Yamasaki et al. | |
| 6,661,218 B2 * | 12/2003 | Kim ........................ | 324/158.1 |
| 6,876,247 B2 * | 4/2005 | Jang et al. ................... | 327/536 |
| 7,114,084 B2 * | 9/2006 | Cioaca ....................... | 713/300 |
| 7,120,058 B2 * | 10/2006 | Seo et al. ................ | 365/185.18 |
| 7,154,785 B2 * | 12/2006 | Roohparvar ........... | 365/185.18 |
| 7,301,375 B2 * | 11/2007 | Song .......................... | 327/108 |
| 2007/0047317 A1 * | 3/2007 | Kim et al. ............. | 365/185.18 |
| 2007/0183205 A1 * | 8/2007 | Lee ....................... | 365/185.18 |

FOREIGN PATENT DOCUMENTS

| | | |
|---|---|---|
| JP | 2002-319283 | 10/2002 |
| JP | 2004-355788 | 12/2004 |
| KR | 1019950003391 | 4/1995 |
| KR | 100248866 | 12/1999 |

* cited by examiner

*Primary Examiner*—Hoai V Ho
*Assistant Examiner*—Michael J Weinberg
(74) *Attorney, Agent, or Firm*—Harness, Dickey & Pierce, P.L.C.

(57) ABSTRACT

A boost voltage generating circuit and method thereof. The example boost voltage generating circuit may include a voltage comparator comparing an input voltage and a reference voltage and generating a control signal based on a result of the voltage comparison, the input voltage based on a feedback boost voltage, a voltage generator generating a boost voltage in response to the control signal and a boost voltage controller including a first resistor with a first end connected to the boost voltage and a second end connected to the voltage comparator, the boost voltage controller controlling a level of current flowing through the first resistor based on one of a number of memory cells to be programmed and a number of cell groups including at least one memory cell to be programmed. The example method may include maintaining a source line voltage for a memory device at a substantially constant voltage level by scaling a boost voltage through control of a level of current flowing through a resistor coupled between a voltage comparator and the boost voltage based on one of a number of memory cells to be programmed in a memory operation and a number of cell groups including at least one memory cell to be programmed in a memory operation.

22 Claims, 8 Drawing Sheets

BOOST VOLTAGE GENERATING CIRCUIT AND METHOD THEREOF

PRIORITY STATEMENT

This application claims the benefit of Korean Patent Application No. 10-2006-0018516, filed on Feb. 25, 2006, in the Korean Intellectual Property Office, the disclosure of which is incorporated herein in its entirety by reference.

BACKGROUND OF THE INVENTION

1. Field of the Invention

Example embodiments of the present invention relate generally to a boost voltage generating circuit and method thereof, and more particularly to a boost voltage generating circuit and method of operating said boost voltage generating circuit.

2. Description of the Related Art

Semiconductor memory devices, such as flash memory devices, may perform reading, programming and erasing operations. Different bias voltages may be applied to flash memory cells of the flash memory devices based on which operation is being performed.

FIG. 1A is a block diagram illustrating a conventional boost voltage generating circuit 10 which may provide a boost voltage to a semiconductor memory device. Referring to FIG. 1A, the conventional boost voltage generating circuit 10 may include a voltage comparator 11, an oscillator 12 and a pumping circuit 13.

FIG. 1B is a circuit diagram illustrating the voltage comparator 11 of FIG. 1A. Referring to FIG. 1B, resistors Rt and Rb may be provided to divide a boost voltage VPP to generate a divided voltage Vdet. The voltage comparator 11 may compare the divided voltage Vdet with a reference voltage Vref.

Referring to FIGS. 1A and 1B, the voltage comparator 11 may receive feedback of the boost voltage VPP created by the pumping circuit 13, may divide the boost voltage VPP and may compare the divided voltage Vdet with the reference voltage Vref. Based on the comparison result, the voltage comparator 11 may output a control signal OSCEN. The oscillator 12 may generate an oscillation signal in response to the control signal OSCEN. The pumping circuit 13 may generate the boost voltage VPP in response to the oscillation signal.

Referring to FIGS. 1A and 1B, if the boost voltage VPP rises above a threshold level, the voltage comparator 11 may output a control signal OSCEN at a disabled level (e.g., a second logic level, such as a lower logic level or logic "0") as opposed to an enabled level (e.g., a first logic level, such as a higher logic level or logic "1"). In addition, the boost voltage VPP created by the pumping circuit 13 may cease increasing and may be maintained at a relatively stable level.

Referring to FIGS. 1A and 1B, if the boost voltage generating circuit 10 is used in a flash memory device, the boost voltage VPP and a first voltage (not shown) may be provided to a switch 20. The switch 20 may transfer a second voltage to a memory cell based on a memory operation mode (e.g., a reading mode, a programming mode, an erasing mode, etc.) of the flash memory device.

Referring to FIGS. 1A and 1B, in the programming mode of the flash memory device, if a source side hot carrier injection process is used, a current may be flow from the switch 20 towards memory cells of the flash memory device. Data signals D0 to Dn-1 may be input to n memory cells controlled by a single word line WL, and the current may flow via memory cells to which a data signal set to a second logic level (e.g., a lower logic level or logic "0") may be input.

Referring to FIGS. 1A and 1B, the switch 20 may be a MOS transistor, and may have a resistive component if the MOS transistor is turned on. If the data signal set to the second logic level (e.g., a lower logic level or logic "0") is input to the memory cells, and a current flowing from the switch 20 via the memory cells increases, the boost voltage VPP may be reduced due to the MOS transistor of the switch 20. As a result, a source line voltage VSL applied to the memory cells may be less than the boost voltage VPP provided by the boost voltage generating circuit 10.

FIG. 2 is a graph illustrating a boost voltage provided to a semiconductor memory device by the boost voltage generating circuit 10 of FIG. 1. Referring to FIG. 2, in the programming mode of the flash memory device of which the memory cells are controlled by a single word line WL, a voltage drop $\Delta V$ of the source line voltage VSL applied to a source line may increase as the number of memory cells to be programmed to store the data bit set to the second logic level (e.g., a lower logic level or logic "0") increases, whereas the boost voltage VPP may remain substantially constant.

FIG. 3 is a circuit diagram illustrating a conventional boost voltage generating circuit. Referring to FIG. 3, the boost voltage generating circuit may include a block 40 which may generate a boost voltage VPP varying based on the number of memory cells to be programmed to store the data bit set to the second logic level (e.g., a lower logic level or logic "0"). The block 40 may be connected between a feedback boost voltage source VPP and a voltage comparator 11.

Referring to FIG. 3, the block 40 may control the boost voltage VPP, and may include a transistor group 41 having 32 NMOS transistors which may be respectively gated by data signals Data<31:0> and may be connected with one another in parallel, if the number of memory cells connected to a single word line WL is 32. Among the data signals Data<31:0>, if the data signal set to the second logic level (e.g., a lower logic level or logic "0") increases, an equivalent resistance of the transistor group 41 may decrease. Thus, a current flowing through a plurality of resistors Rw, Rx, Ry and Rz may increase.

Referring to FIG. 3, if the current increases, a voltage drop caused by the respective resistors Rw, Rx, Ry and Rz may increase. Therefore, a voltage input to positive nodes of a comparator group 43 having a plurality of comparators (e.g., 3 comparators) may decrease. Accordingly, due to output signals of the comparator group 43, an equivalent resistance of a resistor group 44 connected between the boost voltage VPP and the voltage comparator 11 may decrease. In addition, as current that flows via the resistor group 44 and the voltage comparator 11 increases, a voltage signal Vdef input to a positive node of the voltage comparator 11 may decrease. If the voltage signal Vdef decreases with respect to the feedback boost voltage source VPP, a final boost voltage may increase.

In the conventional boost voltage generating circuit illustrated in FIG. 3, the voltage signal Vdet may change based on the number of the data signals set to the second logic level (e.g., a lower logic level or logic "0") among memory cells to be programmed, by the unit of a multiple of eight. In other words, a turning on MOS transistors P1 to P3, included within the resistor group 44, may be controlled based on whether the number of the data signals set to the second logic level is equal to or less than 8, 16, 24, etc. (e.g., multiples of eight).

FIG. 4 is a graph illustrating a boost voltage provided to a semiconductor memory device by the boost voltage generating circuit of FIG. 3. Referring to FIG. 4, a generated boost voltage VPP may not increase linearly as the number of data signals set to the second logic level (e.g., a lower logic level or logic "0") increases. Thus, a source line voltage VSL provided to a source line may decrease. Additional resistors and comparators may be included to limit a reduction to the source line voltage VSL, but adding circuitry may increase a cost and size of the semiconductor memory device. In addition, because a turn-on current of NMOS transistors included in the transistor group 41 may depend upon manufacturing processes or temperature, an increase of the boost voltage VPP may deteriorate in the programming mode of the memory cells.

SUMMARY OF THE INVENTION

An example embodiment of the present invention is directed to a boost voltage generating circuit, including a voltage comparator comparing an input voltage and a reference voltage and generating a control signal based on a result of the voltage comparison, the input voltage based on a feedback boost voltage, a voltage generator generating a boost voltage in response to the control signal and a boost voltage controller including a first resistor with a first end connected to the boost voltage and a second end connected to the voltage comparator, the boost voltage controller controlling a level of current flowing through the first resistor based on one of a number of memory cells to be programmed and a number of cell groups including at least one memory cell to be programmed.

Another example embodiment of the present invention is directed to a method of operating a boost voltage generating circuit, including maintaining a source line voltage for a memory device at a substantially constant voltage level by scaling a boost voltage through control of a level of current flowing through a resistor coupled between a voltage comparator and the boost voltage based on one of a number of memory cells to be programmed in a memory operation and a number of cell groups including at least one memory cell to be programmed in a memory operation.

Another example embodiment of the present invention is directed to a boost voltage generating circuit generating a boost voltage so that a source line voltage applied to memory cells of a flash memory device remains substantially constant.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1A:
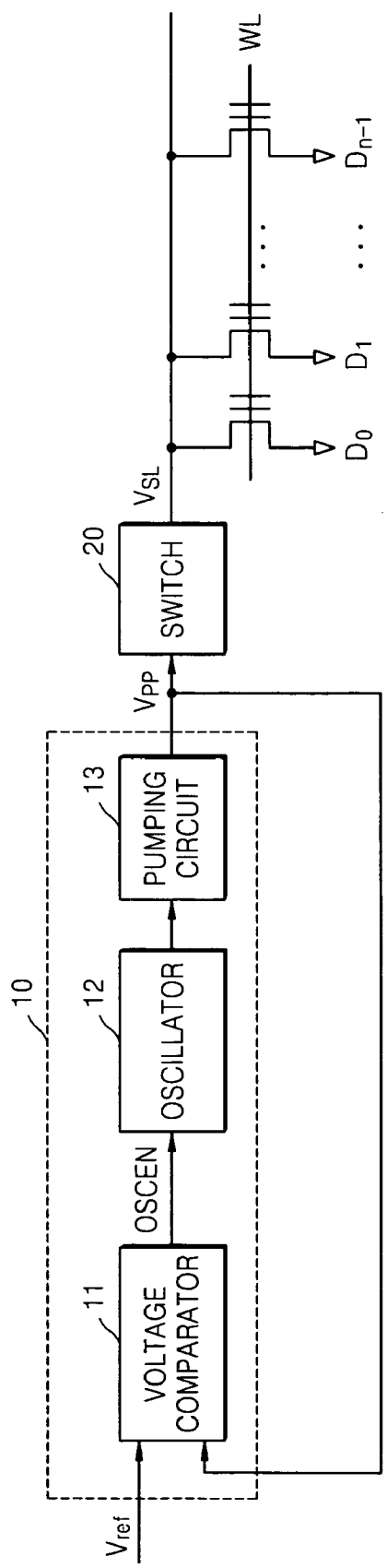
FIG. 1A is a block diagram illustrating a conventional boost voltage generating circuit which may provide a boost voltage to a semiconductor memory device.
Figure 1B:
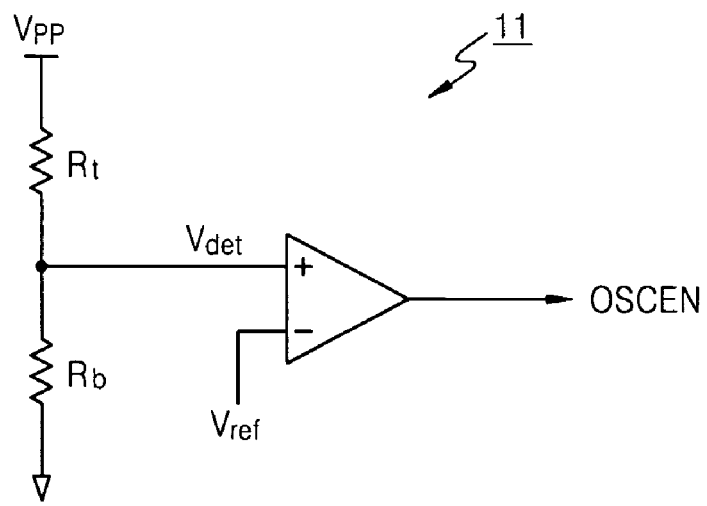
FIG. 1B is a circuit diagram illustrating a conventional voltage comparator.
Figure 2:
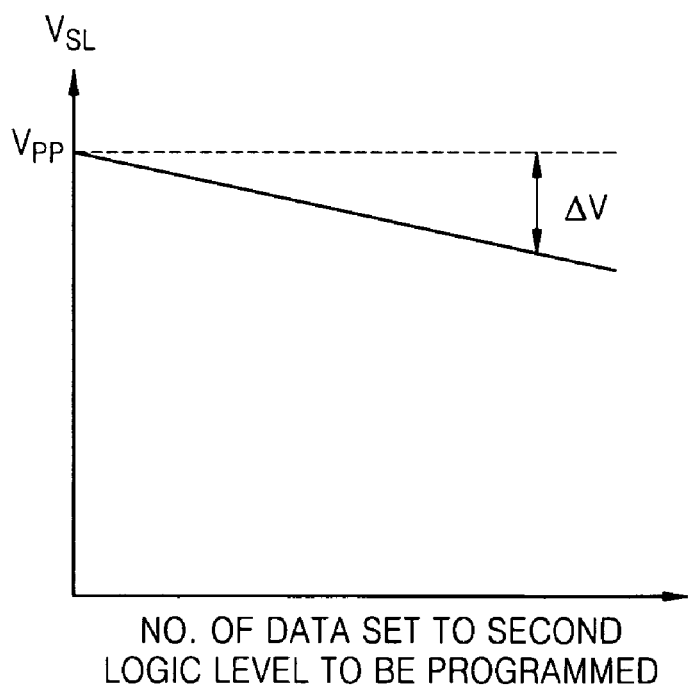
FIG. 2 is a graph illustrating a boost voltage provided to a semiconductor memory device by the boost voltage generating circuit of FIG. 1.
Figure 3:
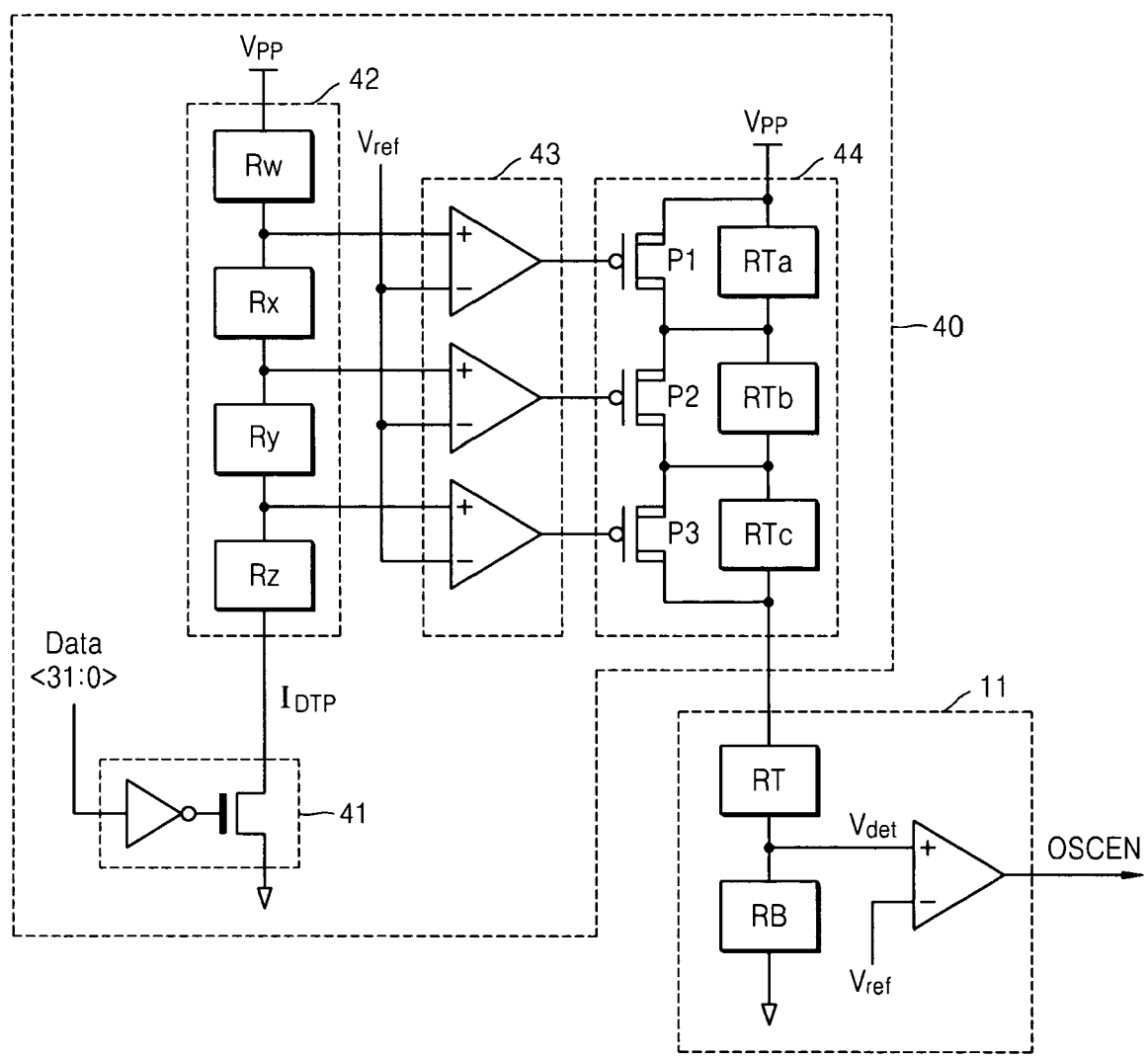
FIG. 3 is a circuit diagram illustrating another conventional boost voltage generating circuit.
Figure 4:
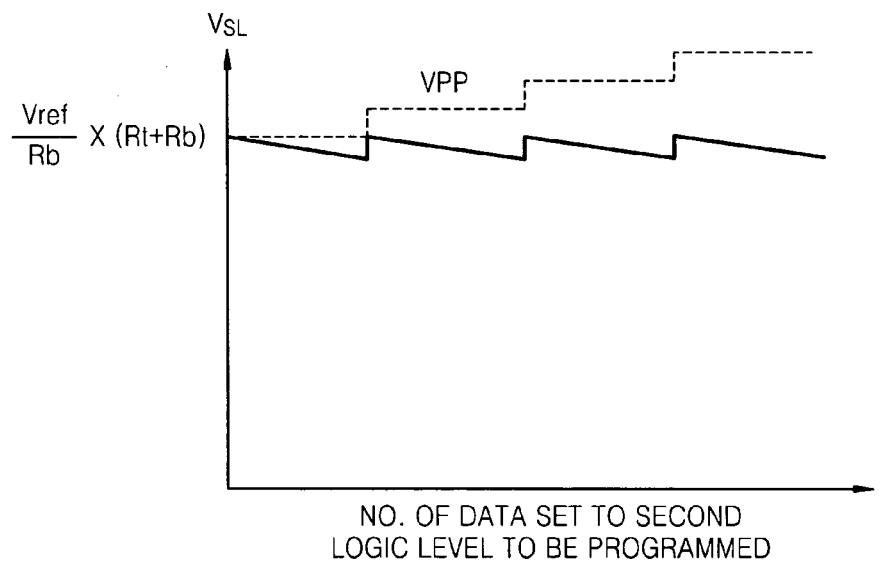
FIG. 4 is a graph illustrating a boost voltage provided to a semiconductor memory device by the boost voltage generating circuit of FIG. 3.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
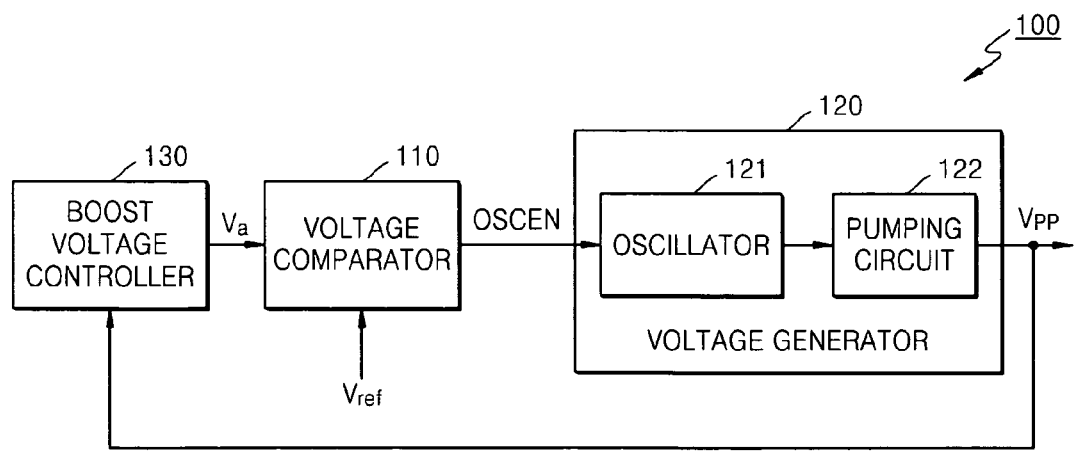
FIG. 5 is a block diagram illustrating a boost voltage generating circuit according to an example embodiment of the present invention.

FIG. 5 is a block diagram illustrating a boost voltage generating circuit 100 according to an example embodiment of the present invention. In the example embodiment of FIG. 5, the boost voltage generating circuit 100 may include a voltage comparator 110, a voltage generator 120 and a boost voltage controller 130. The voltage generator 120 may include an oscillator 121 and a pumping circuit 122.

In the example embodiment of FIG. 5, the voltage comparator 110 may compare an input voltage Va divided from a feedback boost voltage VPP and a reference voltage Vref, to generate a control signal OSCEN based on the voltage comparison result. The voltage generator 120 may receive the control signal OSCEN from the voltage comparator 110, thereby generating the boost voltage VPP. The oscillator 121 included in the voltage generator 120 may generate an oscillation signal in response to the control signal OSCEN. The pumping circuit 122 may generate the boost voltage VPP in response to the oscillation signal.

In the example embodiment of FIG. 5, the boost voltage VPP may be used as a source line voltage in a programming mode of a flash memory device. In an example, if the number of memory cells of the flash memory device to be programmed to store data set to the second logic level (e.g., a lower logic level or logic "0") increases, a voltage transferred to a source line may decrease. Under the control of the boost voltage controller 130, the boost voltage generating circuit 100 may generate a boost voltage VPP that may vary based on the number of memory cells of the flash memory device to be programmed to store the data bit set to the second logic level (e.g., a lower logic level or logic "0").

In the example embodiment of FIG. 5, the boost voltage controller 130 may include a first resistor with a first end connected to the voltage generator 120 supplying the feedback boost voltage VPP and a second end connected to the voltage comparator 110. Further, the boost voltage controller 130 may allow a current, which may vary based on the number of memory cells of the flash memory device to be programmed to store the data bit set to the second logic level (e.g., a lower logic level or logic "0"), to flow through the first resistor. Accordingly, the boost voltage controller 130 may provide a voltage Va, which may vary based on the number of memory cells to be programmed to store the data bit set to the second logic level, to the voltage comparator 110, irrespective of a voltage level of the boost voltage VPP. In addition, a stabilized boost voltage VPP generated by the boost voltage generating circuit 100 may vary in response to the voltage applied to the first resistor.

Figure 6:
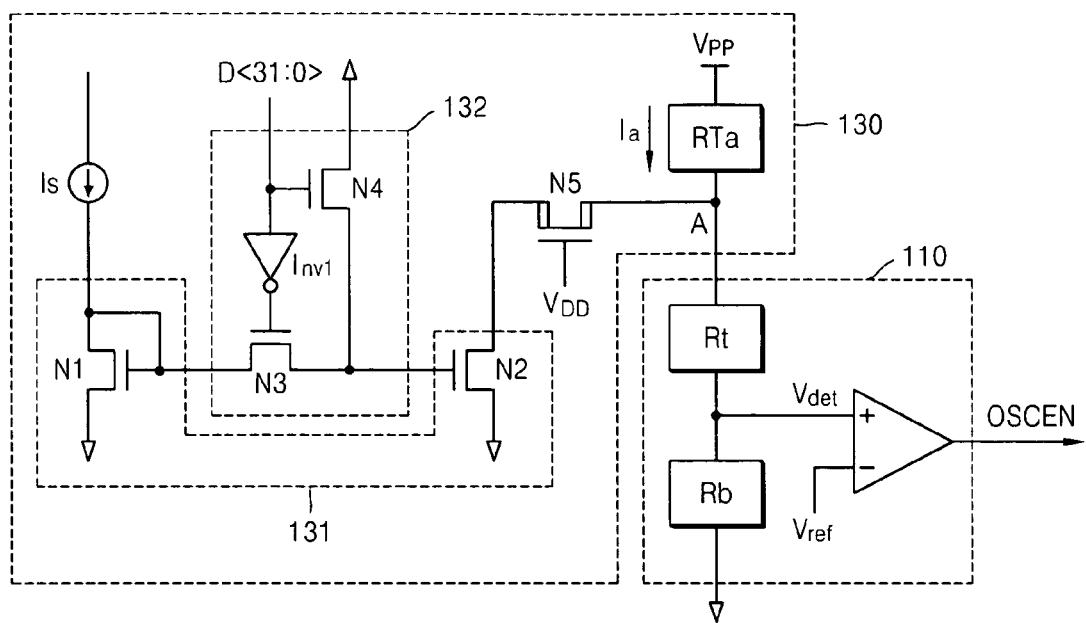
FIG. 6 is a circuit diagram illustrating a voltage comparator and a boost voltage controller of the boost voltage generating circuit of FIG. 5 according to another example embodiment of the present invention.

FIG. 6 is a circuit diagram illustrating the voltage comparator 110 and the boost voltage controller 130 of the boost voltage generating circuit 100 of FIG. 5 according to another example embodiment of the present invention. In the example embodiment of FIG. 6, the boost voltage controller 130 may include a plurality of current mirrors 131 and a plurality of current mirror controllers 132. The current mirrors 131 may be connected to a node A. The node A may be positioned between a first resistor RTa and a voltage comparator 110.

In the example embodiment of FIG. 6, in an example, the boost voltage controller 130 of FIG. 6 may be used if the flash memory device includes 32 memory cells controlled by a single word line WL. Here, the current mirrors 131 may be connected with one another in parallel. Accordingly, a portion of a current Ia that flows via the first resistor RTa may be divided so as to flow through the respective current mirrors 131. Each of the current mirrors 131 may include a current source Is and NMOS transistors N1 and N2.

In the example embodiment of FIG. 6, the current mirror controllers 132 may be respectively connected to the current mirrors 131, to control an enabling of the current mirrors 131. Thus, the current mirror controllers 132 may respectively receive inputs of data signals D<31:0>, and may enable or disable the current mirrors 131 based on logic levels of the data signals D<31:0>. Each of the current mirror controllers 132 may include NMOS transistors N3 and N4 and an inverter Inv1.

In the example embodiment of FIG. 6, the boost voltage controller 130 may further include a higher voltage transistor N5 connected between the first resistor RTa and each of the current mirrors 131. For example, in FIG. 6, the higher voltage transistor N5 may include an NMOS transistor controlled by a power voltage VDD.

In the example embodiment of FIG. 6, the higher voltage transistor N5 may reduce a voltage at a node A by as much as a threshold voltage, to be provided to the current mirrors 131. Accordingly, reliability deterioration may be reduced (e.g., which may otherwise occur if a higher voltage is directly applied to a transistor (e.g., N2) included in a current mirror). Alternatively, if the higher voltage transistor N5 is not used, a transistor (e.g., N2) connected to the first resistor RTa may be implemented as a higher voltage transistor from the transistors respectively included in the current mirrors 131.

Figure 7:
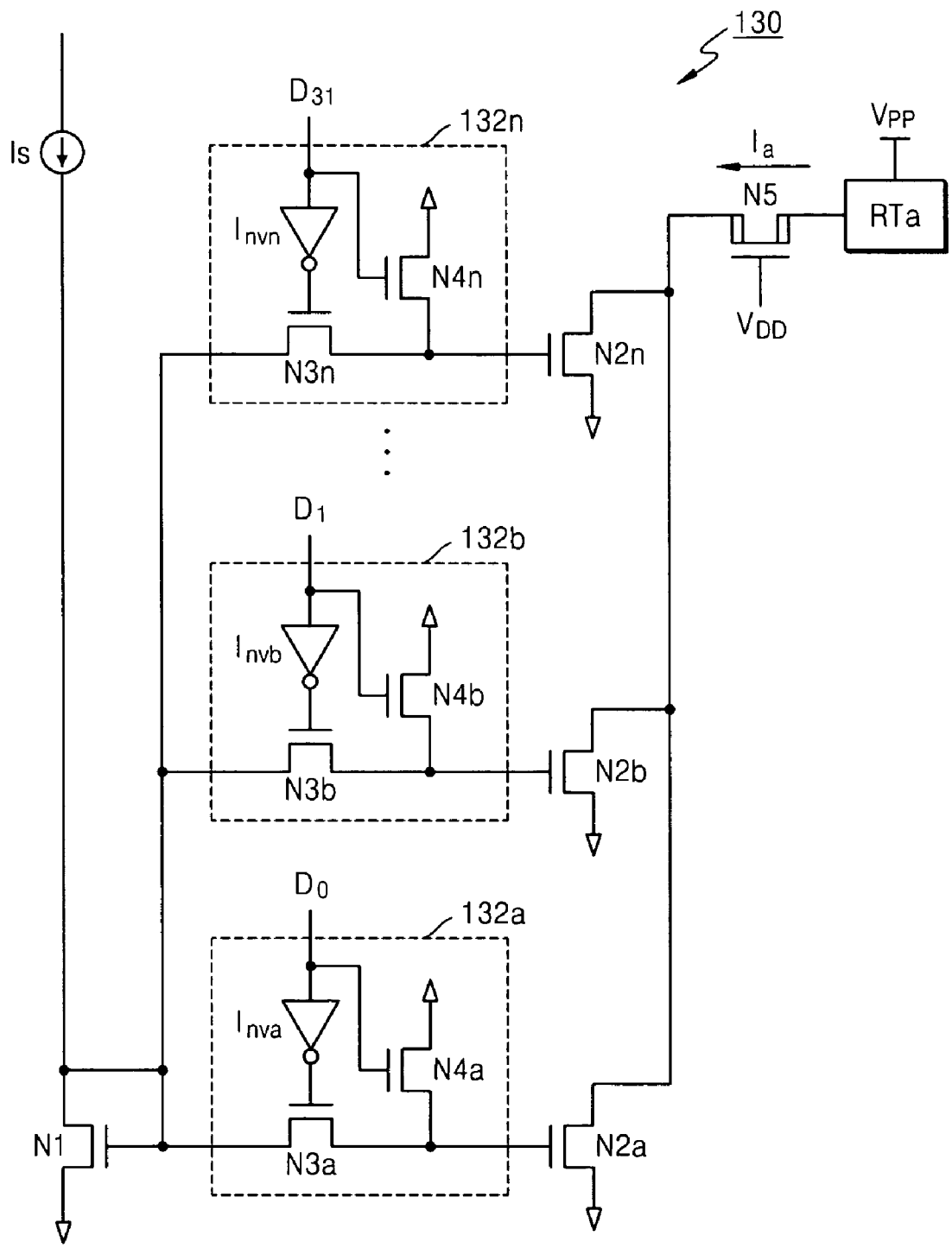
FIG. 7 is a circuit diagram illustrating the boost voltage controller of FIG. 6 according to another example embodiment of the present invention.

FIG. 7 is a circuit diagram illustrating the boost voltage controller 130 of FIG. 6 according to another example embodiment of the present invention. FIG. 7 further illustrates in greater detail a connection between the current mirrors 131 and the current mirror controllers 132.

In the example embodiment of FIG. 7, the current mirrors 131 may be connected with one another in parallel. For example, the current mirrors 131 may be connected with one another in parallel so as to share a current source Is and an NMOS transistor N1. In an example, if 32 memory cells are connected to a single word line, 32 current mirrors 131 may be connected in parallel, and so on. The current mirrors 131 may include the NMOS transistors N1 and N2a constituting a first current mirror, the NMOS transistors N1 and N2b constituting a second current mirror, . . . , and the NMOS transistors N1 and N2n constituting a 32nd current mirror.

In the example embodiment of FIG. 7, the current mirror controllers 132 may be respectively connected to the first current mirror 131 through the 32nd current mirror 131. As shown in the example embodiment of FIG. 7, the first current mirror controller 132a connected to the first current mirror may receive an input of a data signal D0 to control the first current mirror, and may include two transistors N3a and N4a and one inverter Inva. The second current mirror controller 132b may receive an input of a data signal D1 to control the second current mirror, and may include two transistors N3b and N4b and one inverter Invb. The 32nd current mirror controller 132n may receive an input of a data signal D31 to control the 32nd current mirror, and may include two transistors N3n and N4n and one inverter Invn.

Example operation of the boost voltage generating circuit 100 having the aforementioned structure will now be described with reference to FIGS. 5 to 7.

In example operation of the boost voltage generating circuit 100 of FIGS. 5 through 7, in the program mode of the flash memory device where among 32 memory cells receiving a voltage through source lines, if a data signal D0 input to one memory cell is set to the second logic level (e.g., a lower logic level or logic "0"), and data signals D1 to D32 input to a remainder of the memory cells are set to the first logic level (e.g., a higher logic level or logic "1"), the first current mirror may be enabled, whereas the second current mirror to the 32nd current mirror may be disabled.

In example operation of the boost voltage generating circuit 100 of FIGS. 5 through 7, among the transistors included in the first current mirror controller 132a, the transistor N3a may be turned on, and the transistor N4a may be turned off. Thus, the transistors N1 and N2a constituting the first current mirror 131 may be connected with each other.

In example operation of the boost voltage generating circuit 100 of FIGS. 5 through 7, among the transistors included in the second current mirror controller 132b, the transistor N3b may be turned off, and the transistor N4b may be turned on. Thus, the transistor N2b constituting the second current mirror may be connected to a ground node through the transistor N4b. Current mirror controllers to which a data signal set to the first logic level (e.g., a higher logic level or logic "1") is input may also disable current mirrors respectively connected thereto in the same manner as above.

In example operation of the boost voltage generating circuit 100 of FIGS. 5 through 7, if one current mirror is enabled among the 32 current mirrors, a current corresponding to a current source Is may flow to the enabled current mirror through the first resistor RTA and the higher voltage transistor N5. Because, in this example, one current mirror is enabled, the current corresponding to the current source Is may flow towards the enabled current mirror in addition to a current flowing to the voltage comparator 110 through the first resistor RTa.

In example operation of the boost voltage generating circuit 100 of FIGS. 5 through 7, in an alternative example, if data signals D0 to D32 input to the 32 memory cells are each equal to the second logic level (e.g., a lower logic level or logic "0") in the programming mode of the flash memory device, the first current mirror to the 32nd current mirror may each be enabled. Thus, a current corresponding to the current source Is may flow towards the enabled current mirrors, respectively. Because, in this example, 32 current mirrors are enabled, a current equal to as much as 32 times of the current source Is may flow towards the enabled current mirrors in addition to a current flowing to the voltage comparator 110 through the first resistor RTa. Accordingly, a voltage drop caused by the first resistor RTa may increase based on the corresponding increase in the number of memory cells to be programmed.

In example operation of the boost voltage generating circuit 100 of FIGS. 5 through 7, for the same boost voltage VPP, if the number of memory cells to be programmed to store the data set to the second logic level (e.g., a lower logic level or logic "0") is relatively small, a higher voltage may be applied to the node A, whereas if the number of memory cells to be programmed to store the data set to the second logic level is relatively large, a lower voltage may be applied to the node A.

If a voltage applied to the node A decreases, a voltage Vdet input to a positive node of the voltage comparator 110 may likewise decrease. Thus, a stabilized boost voltage VPP generated by the boost voltage generating circuit 100 may increase. The stabilized boost voltage VPP constituting the final boost voltage may be expressed as follows $$VPP=Vref^*((RTa+Rt+Rb)/Rb)+n^*Is^*RTa \qquad \text{Equation 1}$$

wherein RTa may denote a resistance of a resistor within the boost controller 130, Rt and Rb may denote resistances of resistors included in the voltage comparator 110, n may denote the number of memory cells to be programmed (e.g., the number of memory cells receiving an input of the data bit set to the second logic level (e.g., a lower logic level or logic "0") and Is may denote a current level of current source Is.

In example operation of the boost voltage generating circuit 100 of FIGS. 5 through 7, with reference to Equation 1, if the number of memory cells to be programmed (e.g., the number of memory cells receiving an input of the data bit set to the second logic level (e.g., a lower logic level or logic "0") increases, the boost voltage VPP may increase based on an increment in proportion to n. In contrast to the conventional art, an example embodiment of the present invention (e.g., as shown in FIGS. 5 through 7) may include current mirrors without comparators, thereby reducing a required area for a circuit implementation. In addition, a number of current mirrors equal to the maximum number of memory cells to be programmed may be provided, thereby providing a more stabilized boost voltage VPP to a source line of the flash memory device.

Figure 8:
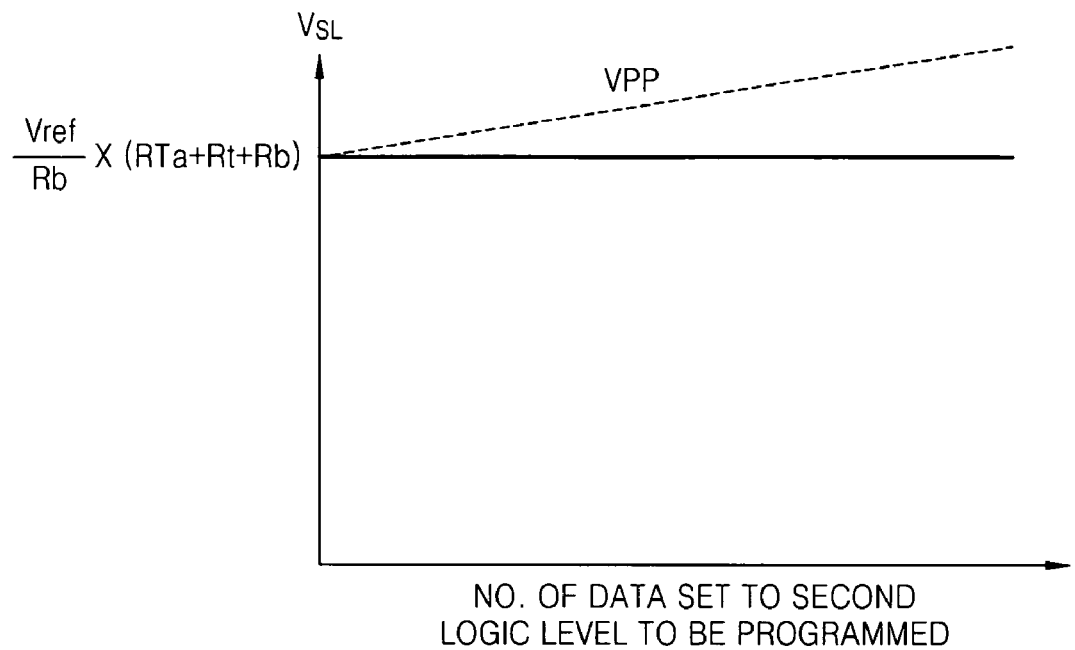
FIG. 8 is a graph illustrating a boost voltage provided to a semiconductor memory device by the boost voltage generating circuit of FIG. 5 according to another example embodiment of the present invention.

FIG. 8 is a graph illustrating a boost voltage provided to a semiconductor memory device by the boost voltage generating circuit 100 of FIG. 5 according to another example embodiment of the present invention. In the example embodiment of FIG. 8, the boost voltage generating circuit 100 may generate a boost voltage VPP which increases as the number of memory cells to be programmed to store the data set to the second logic level (e.g., a lower logic level or logic "0") increases. For example, if the number of memory cells to be programmed to store the data set to the second logic level is 0, in accordance with Equation 1, the boost voltage VPP of Vref*((RTa+Rt+Rb)/Rb) may be generated. In addition, if the number of memory cells to be programmed to store the data set to the second logic level equals n, the boost voltage VPP may be increased by n*Is*RTa.

Figure 9:
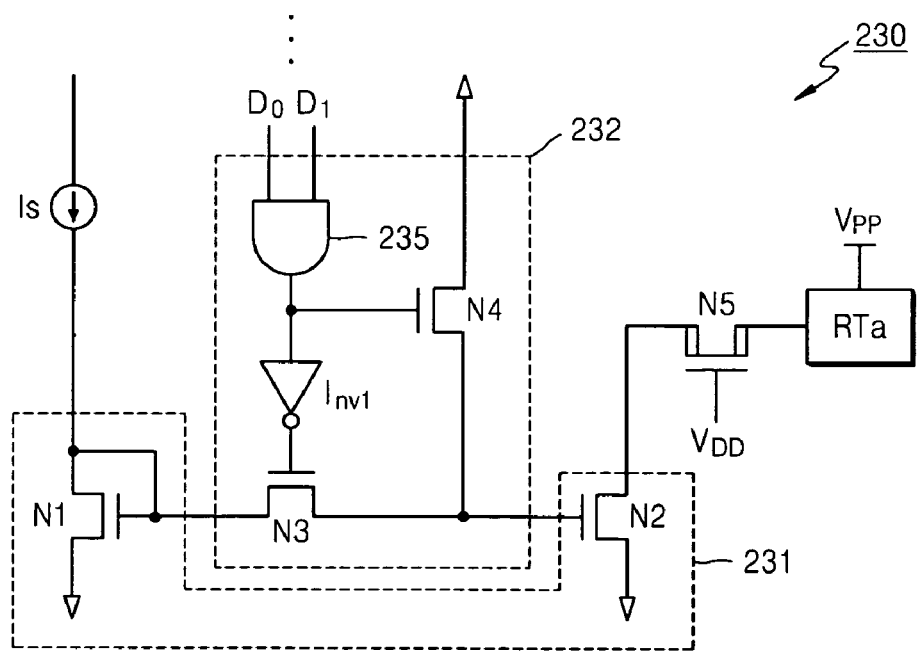
FIG. 9 is a circuit diagram illustrating a boost voltage controller according to another example embodiment of the present invention.

FIG. 9 is a circuit diagram illustrating a boost voltage controller 230 according to another example embodiment of the present invention. In an example, the boost voltage controller 230 may be employed as the boost voltage controller 130 as shown in the example embodiment of FIG. 5.

In the example embodiment of FIG. 9, the boost voltage controller 230 may include a first resistor RTa with a first end connected to a feedback boost voltage VPP and a second end connected to a voltage comparator (not shown). In addition, for N cell groups having M memory cells for each cell group, the boost voltage controller 230 may allow a current, which may vary based on the number of cell groups having one or more memory cells to be programmed, to flow through the first resistor RTa. For example, among the N cell groups, if the number of cell groups having one or more memory cells to be programmed increases, the boost voltage controller 230 may allow a current flowing through the first resistor RTa to increase.

In the example embodiment of FIG. 9, the boost voltage controller 230 may include N current mirrors and a plurality of current mirror controllers. The N current mirrors may be connected to the second end of the first resistor RTa. A first current mirror 231 may include two transistors N1 and N2 and a current source Is. Although not shown, in an example, the N current mirrors may be connected in parallel.

In the example embodiment of FIG. 9, the boost voltage controller 230 may further include N current mirror controllers. The N current mirror controllers may be respectively connected to the N current mirrors. A current mirror controller 232 may include two transistors N3 and N4, an inverter Inv1 and an AND gate 235.

In the example embodiment of FIG. 9, in an example, the boost voltage controller 230 of may have a maximum of 32 memory cells to be programmed (e.g., if M equals 2 and N equals 16). However, example embodiments of the present invention are not restricted to such implementations, and any number of memory cells may be included in other example embodiments of the present invention. In an example, NMOS transistor N5, disposed between the first resistor Rta and the first current mirror 231, may be a higher voltage transistor, and may reduce an occurrence of a higher voltage from being directly applied to the transistor N2 of the first current mirror 231.

Example operation of the boost voltage controller 230 will now be described in greater detail. In example operation of the boost voltage controller 230 of FIG. 9, data signals of one cell group may be input to the AND gate 235. For example, the data signals may be the data signals D0 and D1 input to a cell group having two memory cells. If the data signal D0 and/or the data signal D1 is set to the second logic level (e.g., a lower logic level or logic "0"), the AND gate 235 may output the second logic level. As a result, the transistor N3 of the current mirror controller 232 may be turned on, and the transistor N4 may be turned off. If the transistor N3 is turned on, the current mirror 231 may be enabled, and a current corresponding to the current source Is may flow to the enabled current mirror 231 through the first resistor RTa and the NMOS transistor N5.

In example operation of the boost voltage controller 230 of FIG. 9, the remainder of the 15 current mirrors and current mirror controllers may operate in a manner similar to that described above. For example, data signals D2 and D3 may be input to an AND gate of a second current mirror controller, and a second current mirror may be enabled or disabled in response to the data signals D2 and D3. In addition, data signals D30 and D31 may be input to a $16^{th}$ current mirror controller, and a $16^{th}$ current mirror may be enabled or disabled in response to the data signals D30 and D31, and so on.

In example operation of the boost voltage controller 230 of FIG. 9, similar to the example where 16 cell groups are included, if the number of cell groups having one or more memory cells to be programmed to store a data bit set to the second logic level (e.g., a lower logic level or logic "0") increases, the current flowing through the first resistor RTa may likewise increase. If a voltage drop caused by the first resistor RTa increases with respect to a particular feedback boost voltage VPP, a final boost voltage VPP may likewise increases as described above.

Figure 10:
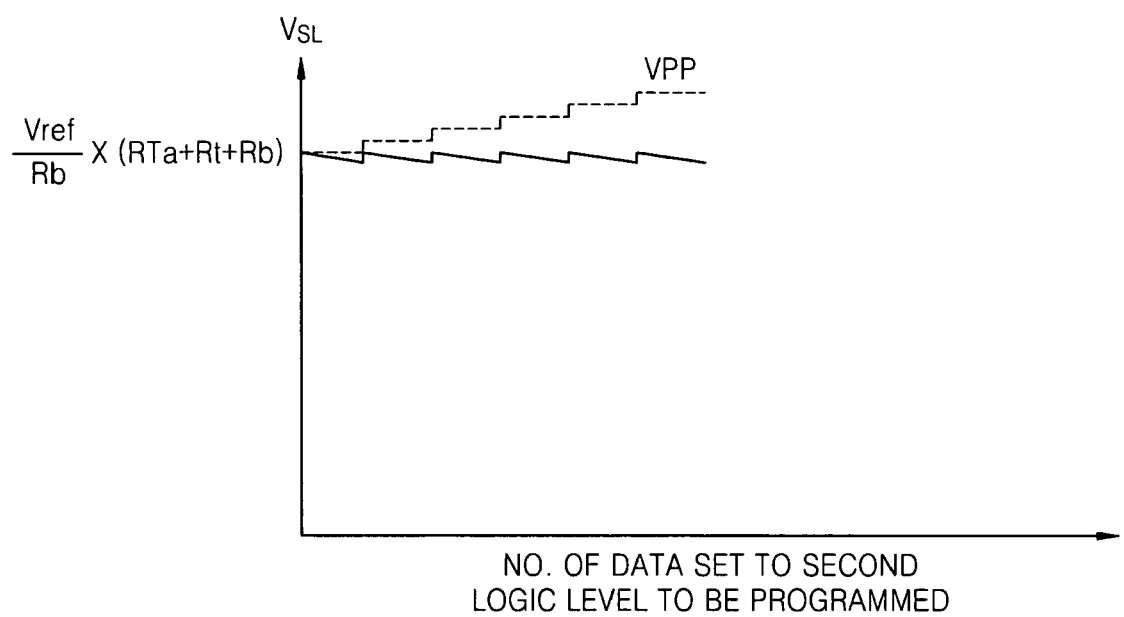
FIG. 10 is a graph illustrating a boost voltage provided to a semiconductor memory device by a boost voltage generating circuit according to another example embodiment of the present invention.

FIG. 10 is a graph illustrating a boost voltage provided to a semiconductor memory device by a boost voltage generating circuit according to another example embodiment of the present invention. In an example, the boost voltage of FIG. 10 may be generated by the boost voltage controller 230 of the example embodiment of FIG. 9. Further, the graph of FIG. 10 may vary based on data signals D0 to D31.

In the example embodiment of FIG. 10, a current flowing through the first resistor RTa may be controlled by combining two data signals, and thus, the boost voltage VPP applied to a source line may be more stabile as compared to that of the conventional art. Further, an area occupied by the boost voltage generating circuit (e.g., boost voltage generating circuit 130 of FIG. 5, boost voltage generating circuit 230 of FIG. 9, etc.) may be reduced.

Accordingly, in another example embodiment of the present invention, a boost voltage may be generated which may vary based on the number of memory cells to be programmed, and thus a source line voltage applied to memory cells of a memory device may be maintained at relatively constant levels, thereby reducing an occurrence of programming failure.

Example embodiments of the present invention being thus described, it will be obvious that the same may be varied in many ways. For example, the first and second logic levels are above-described as corresponding to a higher level and a lower logic level, respectively, in an example embodiment of the present invention. Alternatively, the first and second logic levels/states may correspond to the lower logic level and the higher logic level, respectively, in other example embodiments of the present invention.

Further, while above-described example embodiments of the present invention are described as generally directed to flash memory devices, it is understood that other example embodiments of the present invention may be directed to any type of memory device.

Such variations are not to be regarded as a departure from the spirit and scope of example embodiments of the present invention, and all such modifications as would be obvious to one skilled in the art are intended to be included within the scope of the following claims.

What is claimed is:

1. A boost voltage generating circuit, comprising:
   a voltage comparator comparing an input voltage and a reference voltage and generating a control signal based on a result of the voltage comparison, the input voltage based on a feedback boost voltage;
   a voltage generator generating a boost voltage in response to the control signal; and
   a boost voltage controller including a first resistor with a first end connected to the boost voltage and a second end connected to the voltage comparator, the boost voltage controller controlling a level of current flowing through the first resistor based on one of a number of memory cells to be programmed and a number of cell groups including at least one memory cell to be programmed, wherein the boost voltage controller further includes a plurality of current mirrors and current mirror controllers, the current mirrors being connected between the first resistor and the voltage comparator.

2. The boost voltage generating circuit of claim 1, wherein the boost voltage varies based on the voltage level applied to the first resistor.

3. The boost voltage generating circuit of claim 1, wherein, if the number of memory cells to be programmed increases, the level of current flowing through the first resistor increases.

4. The boost voltage generating circuit of claim 3, wherein a stabilized boost voltage increases in response to an increase to the voltage applied to the first resistor.

5. The boost voltage generating circuit of claim 1, wherein the plurality of current mirror controllers respectively connected to the current mirrors and are configured to control the current mirrors in response to input data signals respectively input to the memory cells.

6. The boost voltage generating circuit of claim 5, wherein the current mirrors are connected in parallel to divide current flowing through the first resistor.

7. The boost voltage generating circuit of claim 6, wherein the plurality of current mirror controllers
respectively disable first current mirrors among the plurality of current mirrors receiving an input data signal equal to a first logic level and
respectively enable second current mirrors among the plurality of current mirrors 8. The boost voltage generating circuit of claim 7, wherein the first logic level is a higher logic level and the second logic level is a lower logic level.

9. The boost voltage generating circuit of claim 7, wherein each of the plurality of current mirrors includes a first transistor and a second transistor, and each of the current mirror controllers includes a third transistor connected between the first transistor and the second transistor; a fourth transistor connected between the second transistor and a ground voltage source and an inverter connected to a gate of the third transistor.

10. The boost voltage generating circuit of claim 9, wherein the third transistor and the fourth transistor are NMOS transistors.

11. The boost voltage generating circuit of claim 10, wherein each of the input data signals is input to a gate of the fourth transistor and an input node of the inverter of a respective one of the plurality of current mirrors.

12. The boost voltage generating circuit of claim 5, wherein the boost voltage controller further includes:
a higher voltage transistor connected between the first resistor and each of the plurality of the current mirrors.

13. The boost voltage generating circuit of claim 5, wherein, in each of the plurality of current mirrors, a transistor connected to the first resistor is a higher voltage transistor.

14. The boost voltage generating circuit of claim 1, wherein the voltage comparator includes:
a second resistor and a third resistor which are connected with the first resistor in series, and the input voltage is a node voltage between the second resistor and the third resistor.

15. The boost voltage generating circuit of claim 1, wherein the voltage generator includes:
an oscillator enabled in response to the control signal; and
a pumping circuit which performs a pumping operation in response to an oscillation signal output from the oscillator, thereby generating the boost voltage.

16. The boost voltage generating circuit of claim 1, wherein the boost voltage is used to operate a flash memory device.

17. The boost voltage generating circuit of claim 1, wherein the cell groups include N cell groups, each of the N cell groups including M memory cells, and the level or current flowing through the first resistor is based on the number of cell groups among the N cell groups having at least one of the M memory cells to be programmed.

18. The boost voltage generating circuit of claim 17, wherein, if the number of cell groups having one or more memory cells to be programmed increases, a current flowing through the first resistor increases.

19. The boost voltage generating circuit of claim 17, wherein the boost voltage controller further includes:
N current mirrors connected between the first resistor and the voltage comparator;
N AND gates which are respectively connected to the N current mirrors and perform an AND operation for data signals input to memory cells of cell groups respectively corresponding to the current mirrors; and
N current mirror controllers which are respectively connected to the N AND gates and control whether a corresponding current mirror is enabled in response to an output signal from the AND gate.

20. The boost voltage generating circuit of claim 19, wherein the N current mirrors are connected in parallel to divide a current flowing through the first resistor.

21. The boost voltage generating circuit of claim 19, wherein the N current mirror controllers
respectively disable first current mirrors among the N current mirrors receiving the output signal of a corresponding AND gate set to a first logic level and
respectively enable second current mirrors among the N current mirrors receiving the output signal of a corresponding AND gate set to a second logic level.

22. A method of operating a boost voltage generating circuit, comprising:
maintaining a source line voltage for a memory device at a substantially constant voltage level by scaling a boost voltage through control of a level of current flowing through a resistor coupled between a voltage comparator and the boost voltage based on one of a number of memory cells to be programmed in a memory operation and a number of cell groups including at least one memory cell to be programmed in a memory operation, wherein the level of current is further controlled by a plurality of current mirrors and current mirror controllers, the current mirrors being connected between the resistor and the voltage comparator.

* * * * *